United States Patent [19]

Bailey et al.

[11] Patent Number: 5,373,253
[45] Date of Patent: Dec. 13, 1994

[54] MONOLITHIC CURRENT MIRROR CIRCUIT EMPLOYING VOLTAGE FEEDBACK FOR $\beta$-INDEPENDENT DYNAMIC RANGE

[75] Inventors: James A. Bailey; James E. Malmberg; Larry L. Tretter, all of Tucson, Ariz.

[73] Assignee: International Business Machines Corporation, Armonk, N.Y.

[21] Appl. No.: 124,178

[22] Filed: Sep. 20, 1993

[51] Int. Cl.$^5$ ............................................... H03F 3/24
[52] U.S. Cl. ..................................... 330/288; 323/315
[58] Field of Search .................. 330/288; 323/315, 316

[56] References Cited

U.S. PATENT DOCUMENTS

| | | | |
|---|---|---|---|
| 4,412,186 | 10/1983 | Nagano | 330/288 |
| 4,462,005 | 7/1984 | Kusakabe et al. | 330/288 |
| 4,473,794 | 9/1984 | Early et al. | 323/315 |
| 4,769,619 | 9/1988 | Taylor | 330/288 |
| 5,079,518 | 1/1992 | Wakayama | 330/288 |

OTHER PUBLICATIONS

Rolf Unbehauen, Andrzej Cichocki, *MOS Switched-Capacitor and Continuous-Time Integrated Circuits and Systems: Analysis and Design,* Springer-Verlag, New York, 1989, pp. 122–127.
Paul R. Gray and Robert G. Meyer, *Analysis and Design of Analog Integrated Circuits,* Second Edition, John Wiley & Sons, New York, 1984, pp. 708–719.
Adel S. Sedra and Kenneth C. Smith, *Microelectronic Circuits,* Holt, Rinehart and Winston, New York, 1982, pp. 432–437.
Barrie Gilbert, "Chapter 6: Bipolar Current Mirrors," *Analog IC Design: The Current Mode Approach,* C. Toumazou, et al., Eds., Peter Peregrinus Ltd., London, 1990, pp. 239–296.
Eric A. Vittoz and George Wegmann, "Chapter 7: Dynamic Current Mirrors," *Analog IC Design: The Current Mode Approach,* C. Toumazou, et al., Eds., Peter Peregrinus Ltd., London, 1990, pp. 297–326.

Primary Examiner—James B. Mullins
Attorney, Agent, or Firm—Baker, Maxham, Jester & Meador

[57] ABSTRACT

A monolithic bipolar current mirror circuit having linear mirror-gain over four orders of current magnitude independent of device-beta (even if $\beta \rightarrow 1$). A third bipolar feedback transistor coupled to a unipolar buffer transistor provides voltage feedback to eliminate input loading and thereby eliminate the dependence of mirror-gain on device current-gain. The bipolar current mirror circuit can be frequency compensated and can be implemented using either PNP or NPN devices in BiCmos integrated circuit technology.

13 Claims, 2 Drawing Sheets

MONOLITHIC CURRENT MIRROR CIRCUIT EMPLOYING VOLTAGE FEEDBACK FOR β-INDEPENDENT DYNAMIC RANGE

BACKGROUND OF THE INVENTION

1. Field of the Invention

This invention relates generally to current mirror circuits and, more specifically, to bipolar junction transistor (BJT) current mirrors having a large dynamic range that is independent of BJT current gain.

2. Description of the Related Art

The current mirror circuit is a popular building block for accomplishing current reproduction in integrated circuitry. The current mirror in its most basic form consists of two matched transistors with their bases and emitters connected together. In addition, one of the transistors is connected as a diode by shorting its collector to its base. The diode-connected transistor is fed by a signal current source and the mirror output current is taken from the collector of the second transistor, which is maintained in its active-mode operating region by keeping its collector voltage higher than its base voltage at all times. The current mirror circuit is one of several devices known in the integrated circuit arts for reproducing a DC current generated at one location to provide for distribution to other locations within the integrated circuit.

Although the two-transistor current mirror circuit function is independent of supply voltage, the mirror gain is a function of transistor beta ($\beta$), such that the output current $I_o$ divided by the input current $I_i$ is $I_o/I_i 1/(1+2/\beta)$. The art is replete with current mirror design improvements made to increase linear dynamic range and reduce transistor beta dependency. The more complex current mirror designs provide special capabilities, such as high accuracy over many orders of current magnitude, exceptionally high output resistance, very low or very high transfer ratios, and so forth. Reference is made to the tutorial by Barrie Gilbert, "Chapter 6: Bipolar Current Mirrors", pp. 239–296, *Analog IC Design: The Current Mode Approach*, C. Toumazou, et al., Eds., Peter Peregrinus Ltd., London, 1990, for a detailed description of the bipolar current mirror art.

Examples of design improvements include the "Wilson" mirror circuit, which employs a third BJT in the output collector circuit to reduce performance sensitivity to transistor beta. If all three BJTs are assumed to have matched characteristics, the gain of the Wilson mirror circuit is $I_o/I_i=1/(1+1/(\beta^2+2\beta))$. However, even the Wilson mirror circuit suffers from poor linearity when implemented in BiCmos integrated circuit technology because the PNP BJT beta values are often as low as six, introducing linearity errors on the order of two percent. Although this problem can be mitigated by using NPN BJT current mirror designs, PNP designs are necessary for many applications.

Bipolar current mirrors employing field-effect transistor (FET) buffer elements to improve input and output impedance ratios can overcome this beta dependency. For instance, in U.S. Pat. No. 4,473,794, Scott H. Early et al. disclose a current repeater circuit that employs FET helper transistors in a BJT current mirror. Unfortunately, the low FET device transconductance causes such current mirror designs to suffer from large collector voltage variations that degrade mirror linearity because of varying Early voltage effects.

In U.S. Pat. No. 5,079,518, Myles H. Wakayama discloses a current mirror circuit that uses a pair of NMOS FET transistors with a BJT helper transistor coupled to control the gate voltages responsive to input current. While MOS FET current mirror circuits are useful, it is much more difficult to accurately match FET parameters than it is to match BJT parameters in BiCmos integrated circuit technology. Accordingly, there is a clearly felt need for a PNP BJT current mirror design for BiCmos technology that is entirely independent of BJT beta.

These unresolved problems and deficiencies are clearly felt in the art and are solved by this invention in the manner described below.

SUMMARY OF THE INVENTION

This invention solves the above problem by adding a third BJT and a fourth FET to a BJT current mirror circuit to form a voltage feedback loop that sets the input BJT collector voltage to the value needed by the FET to properly drive the BJT base circuits.

It is an object of this invention to provide a BJT current mirror design that is entirely independent of BJT beta. It is an advantage of the apparatus of this invention that a BiCmos PNP current mirror implementation having low BJT beta is still linear over several orders of current magnitude.

It is another object of this invention to provide a beta-independent current mirror design that can be frequency-compensated to overcome the usual current ratio increases at higher frequencies.

The foregoing, together with other objects, features and advantages of this invention, will become more apparent when referring to the following specification, claims and the accompanying drawing.

BRIEF DESCRIPTION OF THE DRAWING

For a more complete understanding of this invention, reference is now made to the following detailed description of the embodiments as illustrated in the accompanying drawing, where.

DETAILED DESCRIPTION OF THE PREFERRED EMBODIMENTS

Figure 1:
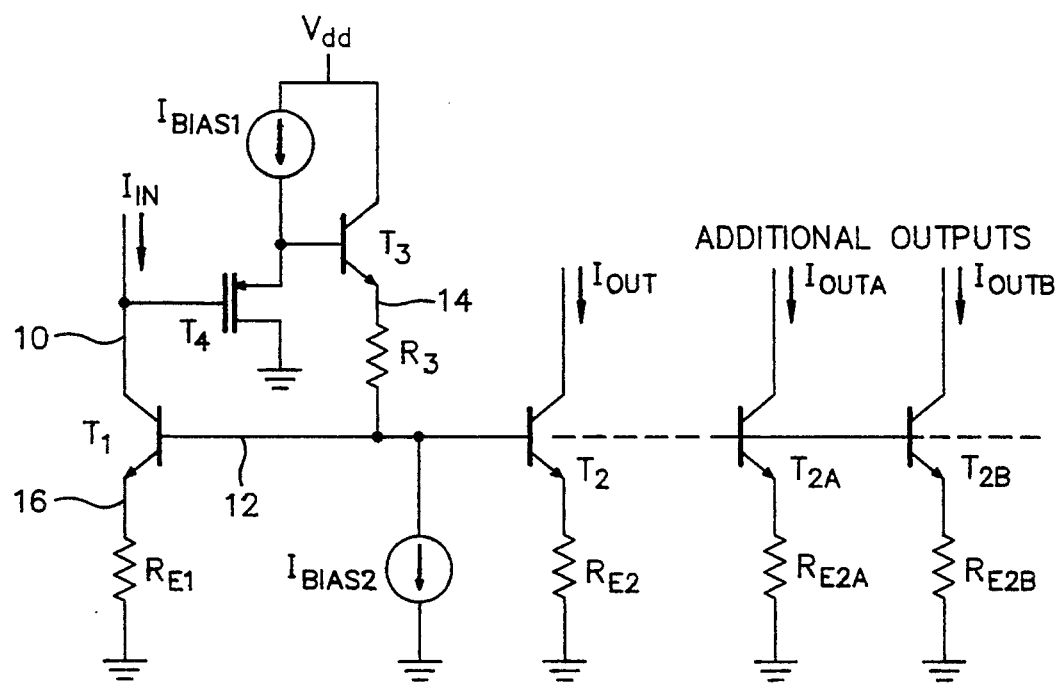
FIG. 1 is an exemplary embodiment of the enhanced NPN current mirror circuit of this invention.

The enhanced current mirror circuit of this invention overcomes the limitations on linearity inherent in bipolar mirrors and FET-buffered current mirrors known heretofore. For the purposes of this disclosure, the basic NPN BJT mirror circuit shown in FIG. 1 demonstrates this invention. The input current $I_{IN}$ flows into the collector 10 of transistor $T_1$ and develops a voltage $V_{IN}$ on collector 10. The voltage $V_{IN}$ is sensed by a source follower device $T_4$, which drives an emitter follower device $T_3$. The emitter follower $T_3$ drives current through resistor $R_3$ and therefrom through the base-emitter circuits of transistors $T_1$ and $T_2$. The current into the base 12 of transistor $T_1$ controls the voltage $V_{IN}$ at collector 10. Thus, it can be appreciated that transistors $T_3$ and $T_4$ form a feedback loop that sets the voltage $V_{IN}$ at collector 10 to the value needed to cause transistor $T_3$ to drive the precise level of base 12 current necessary to bias transistor $T_1$ so that the collector current $I_{IN}$ flows in the input circuit.

Assuming identical BJT characteristics, the voltage at collector 10 is:

$$V_{IN} = V_{C1} = \frac{\beta + 1}{\beta} R_{E1} I_{IN} + \quad \text{[Eqn. 1]}$$

$$\frac{2}{\beta} R_3 I_{IN} + (R_3 I_{BIAS2} + V_{BE1} + V_{BE3} - V_T)$$

where $\beta$ = current gain of bipolar junction transistors $T_1$, $T_2$ and $T_3$;
$R_{E1}$ = transistor $T_1$ emitter resistor;
$R_3$ = transistor $T_3$ emitter resistor;
$I_{BIAS2}$ = fixed source current of transistor $T_4$;
$V_{BE1}$ = base-emitter voltage drop in transistor $T_1$;
$V_{BE3}$ = base-emitter voltage drop in transistor $T_3$; and
$V_T$ = threshold voltage of transistor $T_4$.

The current flowing in the emitter circuit of transistor $T_1$ is:

$$I_{E1} = \frac{\beta + 1}{\beta} I_{IN} \quad \text{[Eqn. 2]}$$

If transistor $T_1$ is identical to transistor $T_2$ and resistor $R_{E1}$ is identical to resistor $R_{E2}$, then the base-emitter voltages and emitter currents of transistors $T_1$ and $T_2$ are also identical. With these assumptions, the output current $I_{OUT}$ is expressed as:

$$I_{OUT} = I_{C2} = \frac{\beta}{\beta + 1} I_{E2} = \quad \text{[Eqn. 3]}$$

$$\frac{\beta}{\beta + 1} I_{E1} = \left(\frac{\beta + 1}{\beta} I_{IN}\right) \frac{\beta}{\beta + 1} = I_{IN}$$

where $I_{C2}$ = the collector current in transistor $T_2$;
$I_{E2}$ = the emitter current in transistor $T_2$; and
$I_{E1}$ = the emitter current in transistor $T_1$.

The constant current source $I_{BIAS1}$ provides current to the source-follower transistor $T_4$ and has no particular effect on mirror circuit operating accuracy. The other constant current source $I_{BIAS2}$ establishes the feedback circuit operating point and is chosen to keep the voltage changes at the emitter 14 of transistor $T_3$ within a reasonable range. Although the values used in Eqn. 3 above assume unity mirror circuit current gain, the value of output resistor $R_{E2}$ and the emitter area of output transistor $T_2$ can be selected to obtain any desired mirror circuit gain. From Eqn. 3, the output current $I_{OUT}$ is shown to be independent of the bipolar transistor current gain $\beta$.

An advantage of the mirror circuit of this invention is that the voltage $V_{C1}$ at collector 10 can be varied by the designer to satisfy several design requirements. $V_{C1}$ can be set as low as a few tenths of a volt above the voltage $V_{E1}$ at the emitter 16 if necessary. For the best possible current mirror accuracy, $V_{C1}$ at collector 10 may be set closely to the output collector voltage $V_{C2}$ at collector 18, thereby forcing the Early voltage effects to balance in transistors $T_1$ and $T_2$.

The two base-emitter voltages $V_{BE1}$ and $V_{BE3}$ are predetermined by current and temperature but the threshold voltage $V_T$ of unipolar transistor $T_4$ can be varied by the designer, depending on the choice of implementation technology. Also, the term $R_3 I_{BIAS2}$ can be independently set by the chip designer.

Because unipolar transistor $T_4$ draws no current from the input at collector 10, transistor $T_4$ introduces no errors arising from circuit loading. These loading effect errors cannot be avoided when using BJT helper devices such as those disclosed in the above-cited Wakayama patent. Moreover, the choice of BJTs for transistors $T_1$ and $T_2$ permits superior matching of base-emitter voltage characteristics compared to the device matching accuracy that is possible using unipolar technology. The typical current mirror circuit known in the art that is based exclusively on FET devices may exhibit no loading characteristic but the FETs are relatively poor in current matching performance because of the poor tracking of FET threshold voltage ($V_T$) characteristics.

The current mirror circuit of this invention requires the four active devices, but this is not a serious disadvantage because the helper device transistor $T_4$ need not be designed to drive heavy loads and therefore can be of minimum size. The two fixed current sources $I_{BIAS1}$ and $I_{BIAS2}$ are also of low power and hence relatively small. The inventors have found by experimentation that the layout area penalty for the three additional devices can be reduced to 20 percent, which is a small price for a significant improvement in current mirror linearity.

FIG. 1 also shows additional output transistors $T_{2A}$ and $T_{2B}$ to illustrate that the current mirror circuit of this invention can support additional outputs with no loss in performance. Normally, transistor $\beta$ dependency in bipolar mirror circuits is exacerbated by the current drain of additional output transistors. Unipolar helper transistors usually suffer greater collector voltage variations with multiple outputs because the helper transistors have low transconductance. Also, the added drive current requires larger collector voltage swings and consequently introduces greater non-linearity from Early voltage effects in the mirror transistors. All of these problems are solved with the current mirror circuit design of this invention shown in FIGS. 1-4.

Figure 2:
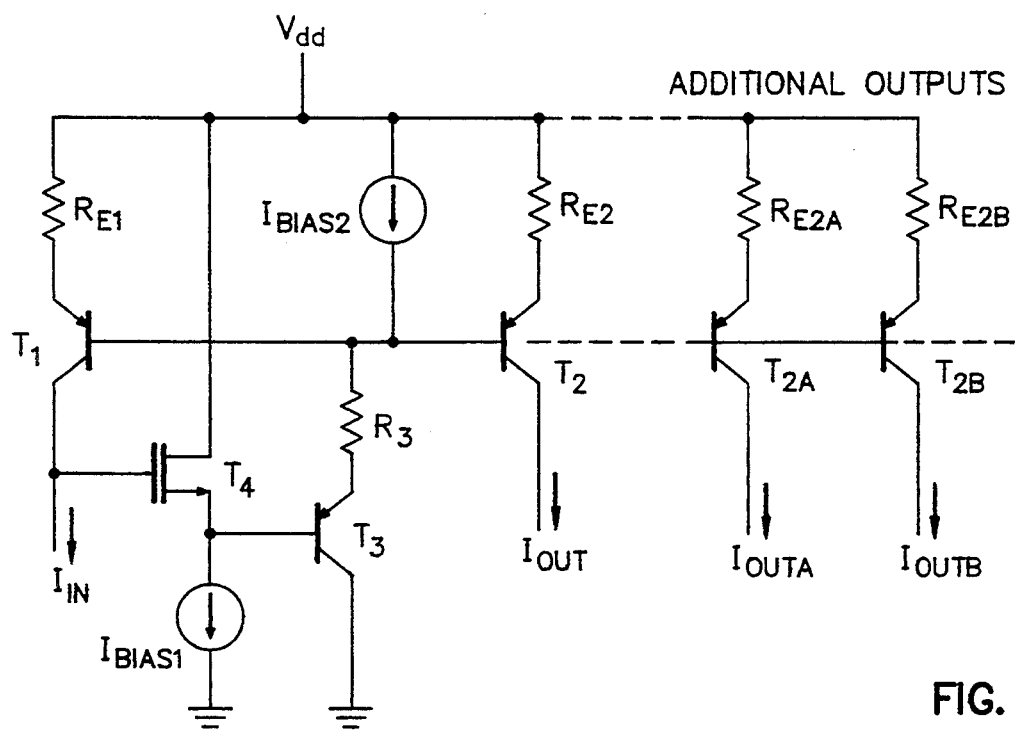
FIG. 2 is an exemplary embodiment of the enhanced PNP current mirror circuit of this invention.

FIG. 2 shows the current mirror circuit of this invention implemented using PNP BJTs with a N-channel unipolar transistor $T_4$, the operation of which may be appreciated with reference to the above discussion in connection with FIG. 1. Because of large differences in the frequency response of the fast unipolar transistor $T_4$ and the relatively slow PNP BJTs $T_1$, $T_2$, and $T_3$, frequency compensation is very desirable for the embodiment shown in FIG. 2. This difference in frequency response between a FET ($T_4$) and the large PNP BJTs ($T_1$-$T_3$) may be as great as three orders of magnitude in many BiCmos device technologies.

Figure 3:
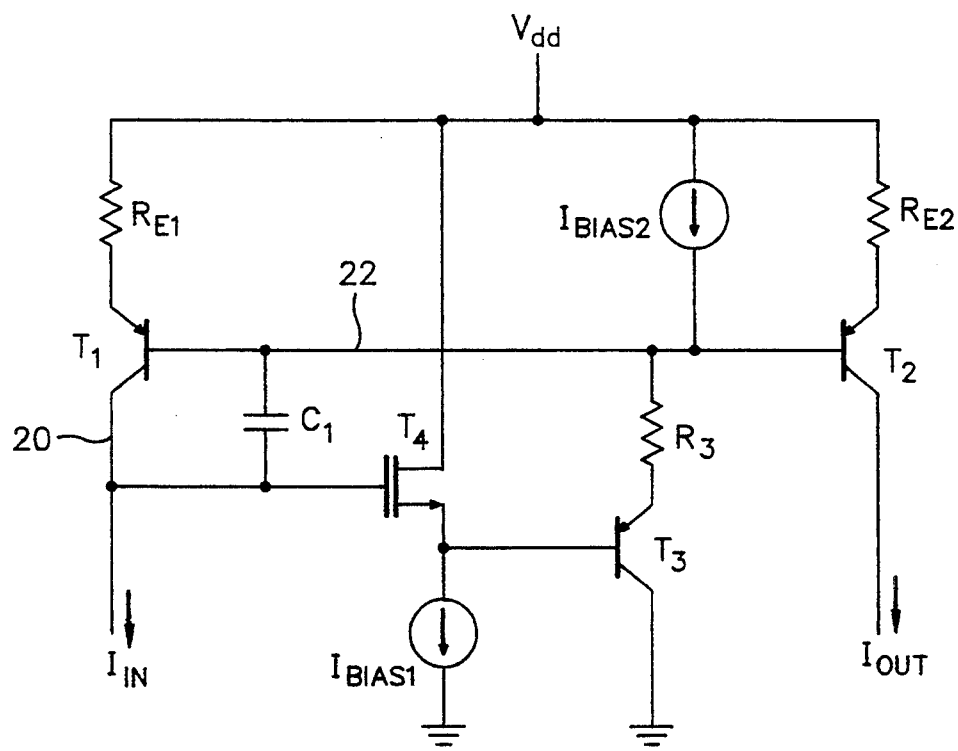
FIG. 3 shows a frequency-compensation technique from the prior art applied to the PNP current mirror circuit of FIG. 2.
Figure 4:
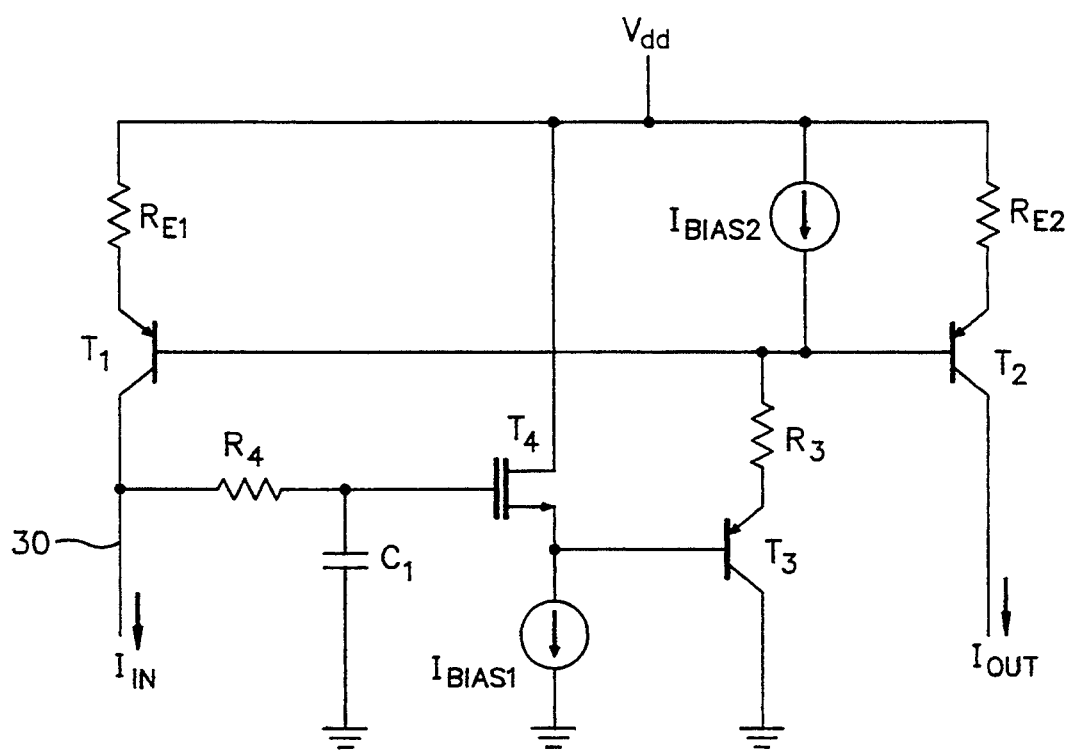
FIG. 4 shows a frequency-compensation technique of this invention applied to the PNP current mirror circuit of FIG. 2.

FIGS. 3 and 4 show two possible frequency compensation techniques for avoiding high frequency instability that are useful with the current mirror circuit of this invention.

In FIG. 3, a feed-forward capacitance $C_1$ is coupled across the base-to-collector junction of input transistor $T_1$ to effectively remove the excessive high-frequency gain of the feedback circuit ($T_3$ and $T_4$) from the current mirror circuit, thereby improving the relative frequency response of the large PNP BJTs $T_1$ and $T_2$. This technique was first suggested at page 266 of the above-cited Gilbert reference in connection with an emitter-follower-augmented current mirror circuit and is useful for avoiding high-frequency instability in the PNP version of the current mirror of this invention when used as shown in FIG. 3. Changes in the collector current $I_{IN}$ of BJT $T_1$ tend to generate large voltage changes at collector 20. Capacitor $C_1$ couples these changes in voltage directly to the emitter circuit 22 at higher frequencies. The polarity of this coupled voltage change is such that the base currents into transistor $T_1$ and output transistor $T_2$ force the corresponding collector currents to match the input current $I_{IN}$. Adding resistor $R_3$ enhances the feed-forward action of capacitor $C_1$ over the prior art. Resistor $R_3$ increases the output impedance of BJT $T_3$, thereby reducing the shunting of feed-forward current from base 22 to ground. Also, adding resistor $R_3$ reduces the size of capacitor $C_1$ required for a particular compensating effect.

The compensation scheme shown in FIG. 4 is designed to slow down or snub the high-frequency gain of the feedback circuit formed by transistors $T_3$ and $T_4$. Resistor $R_4$ and capacitor $C_1$ act to decrease the rate at which unipolar transistor $T_4$ can sense the changes in the collector voltage $V_{C1}$ at collector 30. This reduces the high-frequency response of the feedback circuit to more closely match the slower frequency response of the large PNP BJTs ($T_1$–$T_3$).

Clearly, other embodiments and modifications of this invention will occur readily to those of ordinary skill in the art in view of these teachings. Therefore, this invention is to be limited only by the following claims, which include all such embodiments and modifications when viewed in conjunction with the above specification and accompanying drawing.

We claim:

1. A current repeater comprising:
   current input means for receiving an input current;
   current output means for producing an output current responsive to said input current;
   a first transistor having a collector coupled to said current input means;
   a second transistor having a collector coupled to said output current means;
   a third transistor coupled to said first and second transistors such that the base currents of said first and second transistors pass through said third transistor; and
   a unipolar transistor having a gate coupled to said collector of said first transistor and providing a shunting path for the base current of said third transistor.

2. The current repeater of claim 1 wherein said third transistor is a bipolar junction transistor (BJT).

3. The current repeater of claim 2 wherein said first and second transistors are BJTs.

4. The current repeater of claim 3 wherein said first, second and third BJTs are NPN and said unipolar transistor is a P-channel field-effect transistor (FET).

5. The current repeater of claim 4 further comprising:
   at least one output transistor having its base coupled to the bases of said first and second transistors.

6. The current repeater of claim 4 wherein said current repeater is entirely embodied in a BiCMOS integrated circuit.

7. The current repeater of claim 3 wherein said first, second and third BJTs are PNP and said unipolar transistor is a N-channel FET.

8. The current repeater of claim 7 further comprising:
   at least one output transistor having its base coupled to the bases of said first and second transistors.

9. The current repeater of claim 7 wherein said current repeater is entirely embodied in a BiCMOS integrated circuit.

10. The current repeater of claim 7 further comprising:
    a resistor-capacitor frequency-compensator disposed such that said unipolar transistor gate is coupled to said first transistor collector through a resistance and to ground through a capacitor.

11. The current repeater of claim 7 further comprising a capacitor coupled between said unipolar transistor gate and said first and second transistor bases.

12. The current repeater of claim 1 further comprising:
    at least one output transistor having its base coupled to the bases of said first and second transistors.

13. The current repeater of claim 1 wherein said current repeater is entirely embodied in a BiCMOS integrated circuit.

* * * * *

UNITED STATES PATENT AND TRADEMARK OFFICE
CERTIFICATE OF CORRECTION

PATENT NO. : 5,373,253
DATED : December 13, 1994
INVENTOR(S) : Bailey et al

It is certified that error appears in the above-indentified patent and that said Letters Patent is hereby corrected as shown below:

Column 1, line 34, please insert --=-- following $I_o/I_i$.

Signed and Sealed this

Eleventh Day of April, 1995

Attest:

BRUCE LEHMAN

Attesting Officer

Commissioner of Patents and Trademarks